United States Patent [19]
Wojcicki et al.

[11] Patent Number: 5,424,983
[45] Date of Patent: Jun. 13, 1995

[54] OUTPUT BUFFER AND SYNCHRONIZER

[75] Inventors: Tomasz Wojcicki, Kanata; Francis Larochelle, Hull, both of Canada

[73] Assignee: Mosaid Technologies Incorporated, Kanata, Canada

[21] Appl. No.: 167,044

[22] Filed: Dec. 16, 1993

[51] Int. Cl.[6] .............................................. G11C 7/00
[52] U.S. Cl. ........................... 365/189.05; 365/189.08; 326/62
[58] Field of Search ...................... 365/189.05, 189.08; 307/480, 591, 475

[56] References Cited

U.S. PATENT DOCUMENTS 5,087,840  2/1992  Davies et al. ................... 307/480 X
5,305,271  4/1994  Watanabe ........................ 365/189.05

*Primary Examiner*—Eugene R. LaRoche
*Assistant Examiner*—Son Dinh
*Attorney, Agent, or Firm*—Pascal & Associates

[57] ABSTRACT

The present invention relates to an output buffer for driving an output driver of a random access memory (RAM) circuit to either of opposite binary data values from a data source and a clock wherein the relative timing of data and clock signals is variable or uncertain, comprised of a source of data signals having pulses one of which has a rising edge either being earlier than a leading edge of a data pulse, being later than the leading edge of the data pulse, or being in a race condition with the data pulse, a source of data signals, a latency counter for receiving the clock signals and for outputting a latent control, apparatus for summing the latent clock signal and the data pulse, and apparatus for providing a signal to an output driver from the summing apparatus which is in sync with the latent clock signal.

3 Claims, 4 Drawing Sheets

OUTPUT BUFFER AND SYNCHRONIZER

FIELD OF THE INVENTION

This invention relates to semiconductor memory circuits, and in particular to an output buffer for a random access memory circuit such as a synchronous dynamic random access memory (SDRAM) circuit.

BACKGROUND TO THE INVENTION

A description of SDRAMs may be found in the article "Synchronous DRAMs: Designing to the JEDEC Standard" in MICRON Design Line, volume 2, Issue 2, No 2Q93.

Synchronous DRAMs can utilize different CAS latency modes of operation. For example, for a CAS latency of 1, data which is read by its data bus read amplifier arrives at its output buffer after the clock. For a CAS latency of 3, the data waits for the clock at a stage preceding the output buffer. For a latency of 2 there is a race condition between the data and the clock to the output buffer.

In a standard DRAM driven by RAS/CAS signals, it was always certain that its output buffer would be put into a tri-state mode when /CAS was at high logic level. On the falling edge of the /CAS signal, new data would be driven to the output pin for the output tristate driver. If the data had not yet arrived, the output of the tristate driver would remain at an intermediate logic level until data was available.

In SDRAMs operating at high speeds of e.g. 100 MHz or higher, there is no time for the tristate driver to enter the intermediate level between data pulses that it outputs. The output buffer must switch virtually instantaneously between one logical polarity of binary data pulses to the other.

SUMMARY OF THE INVENTION

The present invention is an output buffer for an SDRAM which can operate at the aforenoted high speeds, provides an output driver signal between two polarities of binary logic levels, and can be driven from data signals that have any of the aforenoted latencies of 1, 3 or 2, that is, wherein the data signals arrive after the clock, arrives before the clock, and is in a race with the clock, respectively.

In accordance with an embodiment of the invention, an output buffer for driving an output driver of a random access memory (RAM) circuit to either of opposite binary data values from a data source and a clock wherein the relative timing of data and clock signals is variable or uncertain, comprising a source of data signals, a source of clock signals having pulses one of which has a rising edge either being earlier than a leading edge of a data pulse, being later than the leading edge of the data pulse, or being in a race condition with the data pulse, a latency counter for receiving the clock signals and for outputting a latent control signal, apparatus for summing the latent control signal and the data pulse, and apparatus for providing a signal to an output driver from the summing means which is in sync with the latent clock signal.

BRIEF INTRODUCTION TO THE DRAWINGS

A better understanding of this invention will be obtained by a consideration of the detailed description below, with reference to the following drawings, in which FIG. 1 is a logic diagram of a preferred embodiment of the invention, FIG. 2 is a one case of timing diagram of signals, used to describe operation of the preferred embodiment of the invention, FIG. 3 is another one case of timing diagram of signals, used to describe operation of the preferred embodiment of the invention, FIG. 4 is a logic diagram of a driver circuit that can be used with the invention, and FIG. 5 is a timing diagram used to explain the operation of the driver circuit of FIG. 4.

DETAILED DESCRIPTION OF THE PREFERRED EMBODIMENT

Figure 1:
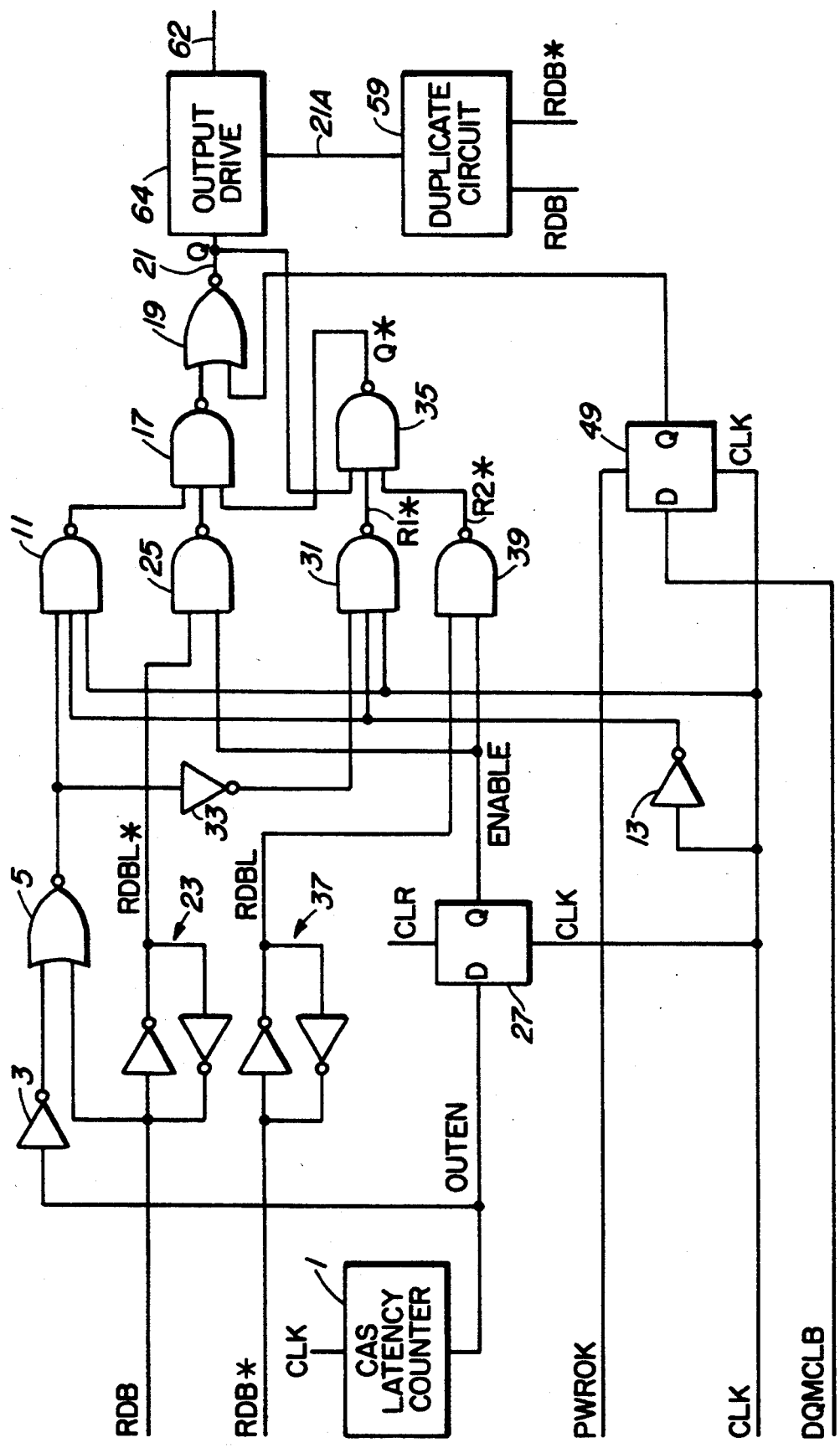

With reference to FIG. 1, binary data is received at the RDB and RDB* inputs from a databus sense amplifier of the SDRAM.

A clock signal CLK is received elsewhere in the SDRAM in a CAS latency counter 1, which has been set from an external control to the desired latency value. The counter 1 will therefore either allow the control signals to pass through without delay, will delay them by one clock pulse, or will delay them by two clock pulses, to provide latencies of 1, 2 or 3 respectively. The output of the CAS latency circuit 1 is referred to herein as a delayed clock signal OUTEN. The clock pulses are also applied to other output buffer circuits.

Figure 2:
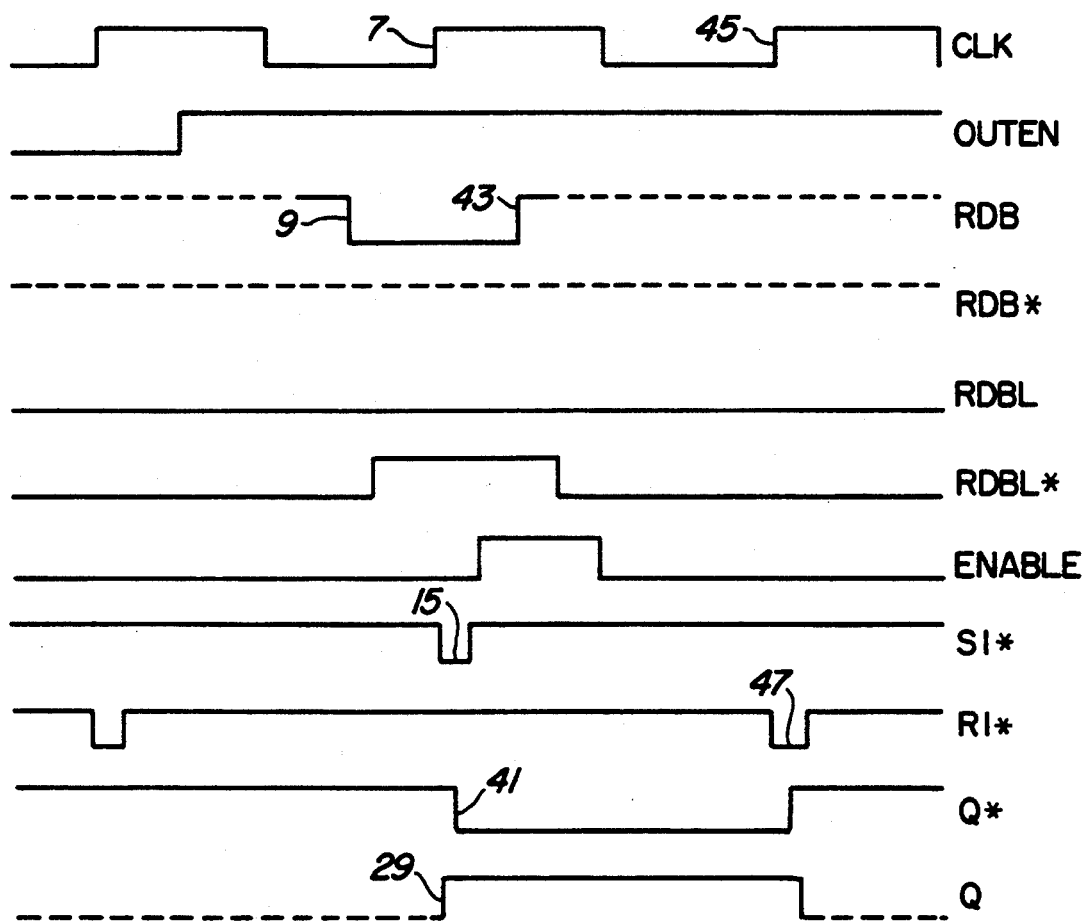

Turning now also to FIG. 2, which is a timing diagram of signals for the case in which the data is received prior to the clock, the first signal shown is the CLK signal, which has regular clock pulses. At a particular time, the CAS latency circuit has counted to a predetermined latency value, and an output signal OUTEN is provided. That signal, inverted in inverter 3, is applied to an input of NOR gate 5. The ENABLE signal is at low logic level, disabling gates 25 and 39. The data can pass only via gate 11 or 39.

As may be seen from FIG. 2, at a time prior to the rising edge 7 of a clock pulse, the leading edge 9 of a negative logic level data pulse RDB appears, which is applied to the other input of NOR gate 5. With the OUTEN signal at high logic level which causes the input to gate 5 to be at low logic level from inverter 3 and RDB at low logic level, the gate 5 changes its output to a high logic level, and applies this logic level to an input of NAND gate 11.

When the CLK signal goes to high logic level at the time of leading edge 7, another input to NAND gate 11 goes to high logic level from the CLK input. The CLK signal is also applied to inverter 13. Prior to its application to that inverter, its output is at high logic level. Thus at that point all three inputs to NAND gate 11 are at high logic level, and its output thus drops to low logic level. When the CLK signal is applied to inverter 13, it takes a short period of time to pass the signal, and then its output goes to low logic level, which is received by one of the inputs of NAND gate 11. The result, at the output S1 of NAND gate 11, is a short low logic level pulse 15, shown in timing diagram S1.

The pulse output of NAND gate 11 is applied through AND gate 17 (and NOR gate 19 if it is used), to output terminal 21 (timing diagram Q), from where it is applied to an output driver at output Q.

Gates 17, 19 and 35 form a latch. If the leading edge of a data pulse arrives before a leading edge of a clock pulse, the aforenoted path is not used. The latch formed of gates 17, 19 and 35 is set by the S1* pulse 15. The ENABLE signal is still low, and disable gate 25 at the time of the S1* pulse 15. The output of gate 25 goes low after the pulse 45, but this is irrelevant for the operation of the circuit.

The negative-going signal is also applied to NAND gate 31, with the positive-going signal level at the output of NOR gate 5 inverted in inverter 33. This causes output R1* of gate 31 to remain at high logic level, which is input to NAND gate 35. With the other data line RDB* stable at high logic level, applied through cross-coupled inverters 37, and applied to an input of NAND gate 39 with the ENABLE signal, NAND gate receives the high logic level R2* at its output. Another input of NAND gate 35 receives the output signal from Q. NAND gate 35 is cross coupled with AND gate 17, and the output at Q causes the output Q* of NAND gate 39, 35 to go to low logic level, with leading edge 41 and latches the RDB data in the cross-coupled NAND gates 17 and 35.

The data pulse RDB eventually goes high, at trailing edge 43. This causes the signal on the RDBL* lead to go to low logic level. The result is that at the next rising leading edge 45 of the CLK signal, there is a low level temporary pulse 47 created at the output of the gate 31 from the CLK and inverted CLK signals, which passes into gate 35, which interrupts the latching effect of gates 17 and 35, which causes the Q, signal to go to high logic level, and once unlatched, the signal at Q to go to low logic level.

It should be noted that an external control can be provided for use by a user to control the operation of the output tri-state buffer by disabling the Q terminal. This can be provided by the use of NOR gate 19, which can be deleted if this user control is not desired. The second input of gate 19 has an input from flip flop 49, which is synchronized by clock signal CLK, and has a data input from user input DQMCLB.

Figure 3:
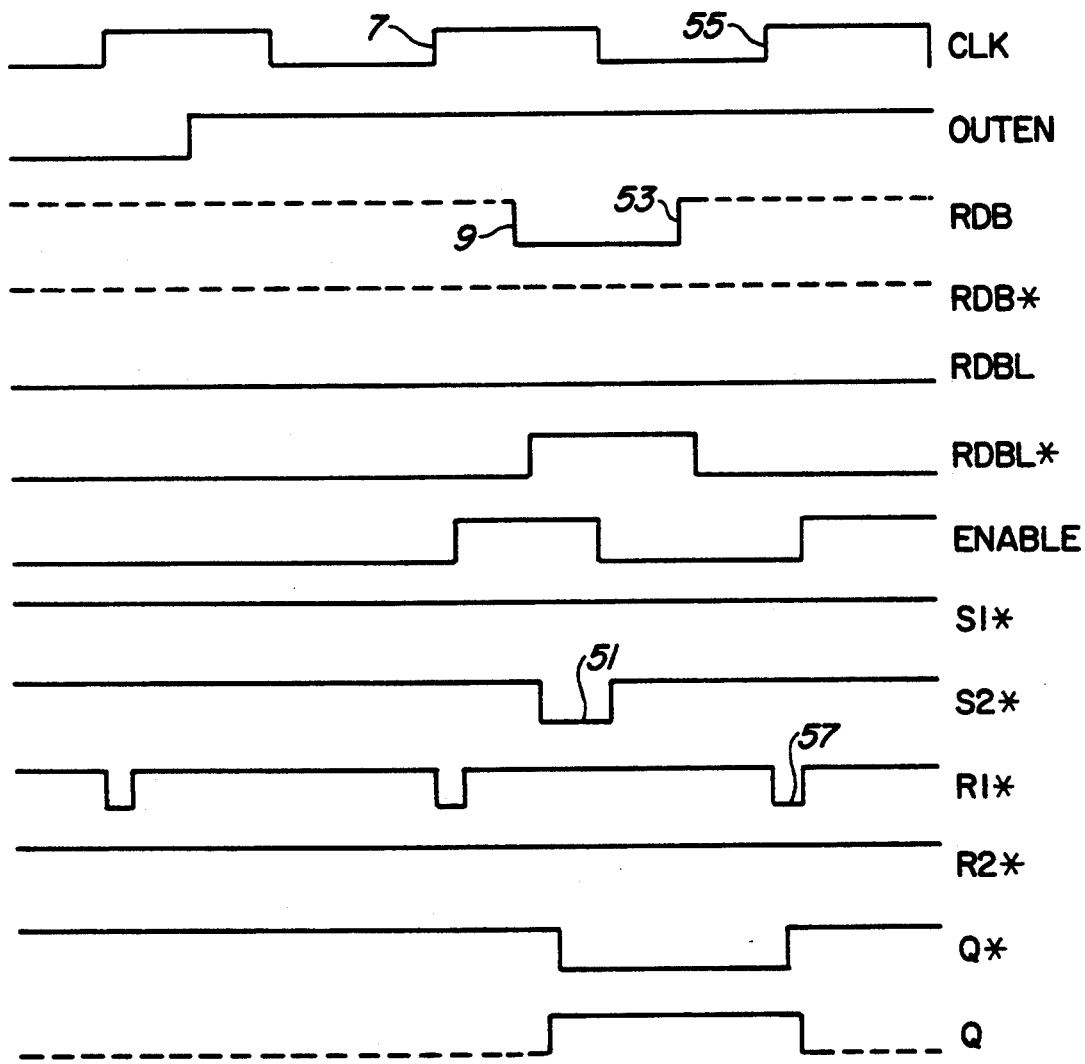

Turning now to FIG. 3, a timing diagram is shown in the case of data leading edge 9 on the RDB lead arriving after the leading edge 7 of the clock pulse, e.g. latency 1. With the RDB data going low coincident with the CLK signal being at high logic level, the RDBL* level goes to high level. Now with the ENABLE signal being high due to the latency counter having counted to an appropriate value and therefore outputting a high level output signal earlier than in the previous example, causing the ENABLE signal to be high, the RDBL* signal being high with the ENABLE signal and applied to the inputs of gate 25, gate 25 outputs the low logic signal 51 shown in FIG. 3. This passes through gate 17 (and gate 19, if used), and appears on output Q, as output signal Q shown in FIG. 3.

The signal is enabled to pass through gate 17 because all its other inputs are at high logic level during this interval. The CLK input to gate 11 is high, the OUTEN signal is high and is inverted in inverter 3 during this interval. With the CLK signal being high and applied to inverter 13, the output of inverter 13 is low causes gate 11 to output a high logic level signal. The ENABLE signal being at high level as described above is applied to gate 39 with the low level RDBL signal, causing gate 35 to be enabled and go to low logic level as shown by waveform Q*, with the output signal Q at pin 21 having gone to high logic level. Gates 17 and 19 thus latch.

The data signal RDB then goes to high level at the trailing edge 53. The RDBL* signal thus goes to low level. The circuit then waits for the next leading edge 55 of the CLK signal, and when the pulse 57 resulting therefrom arrives, gate 31 displays this pulse at its output R1*, causing gate 35 to release the latch, and first the signal Q* at the output of gate 35 goes to high level, and then as a result, the signal Q goes to low level.

Thus it has been seen how the drive terminal Q has been driven to high level and low level by both the conditions of the data from the databus read amplifier arriving before the clock, and with the data arriving after the clock. It will also be seen that the signal at the drive terminal has been synchronized with the clock. In the case of a race condition (latency 2), one or the other of the conditions noted above will occur, but the output drive terminal will still be driven high and low, and synchronized, no matter which condition occurs.

The above-described circuit is duplicated and works similarly as described above, the duplicate circuit being shown as reference numeral 59. Two circuits are used in order to respectively pull the output 62 of a driver circuit up and down respectively.

Figure 4:
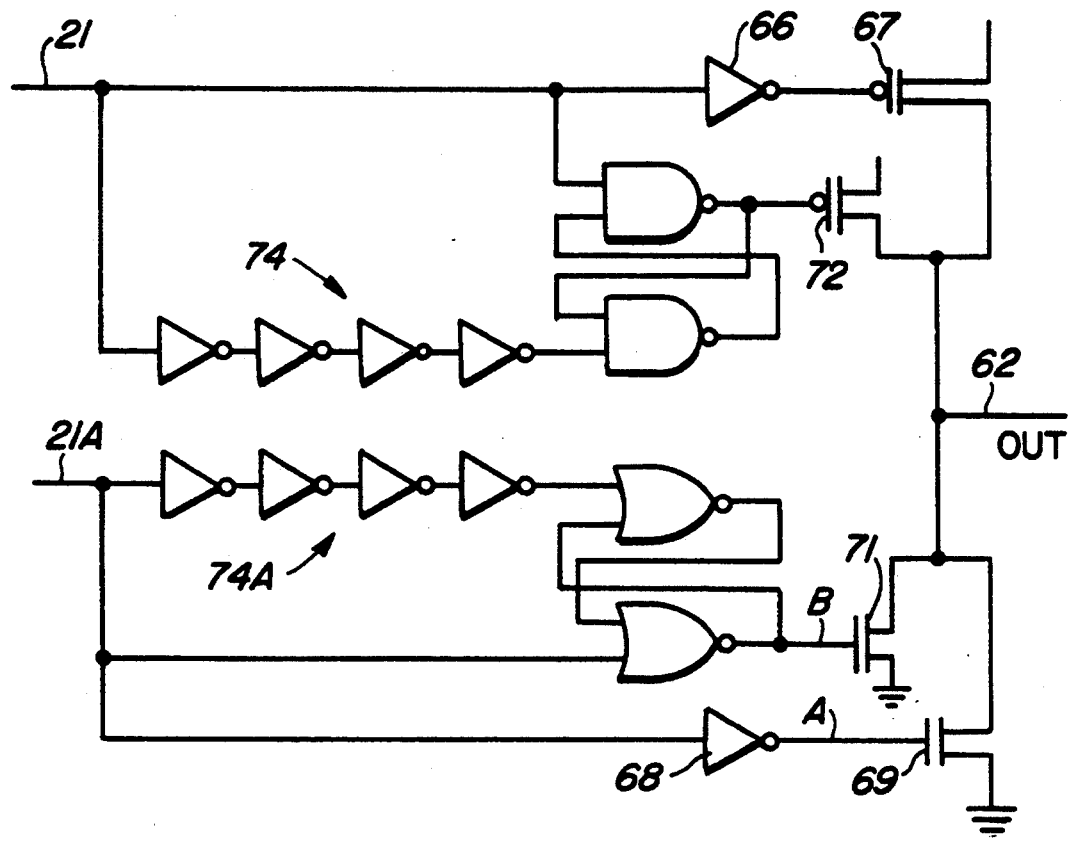

FIG. 4 is a logic diagram of a driver circuit that can be used. Output terminal 21 and corresponding terminal 21A are input to n and p channel output field effect devices. Terminal 21 is connected through inverter 66 to the gate of p channel device 67, which has its drain and source connected between voltage source Vdd and the output 62 of the driver circuit. Terminal 21A is connected through an inverter 68 to the gate of an n channel device 69, which has its source and drain connected between ground and the output 62.

In order to provide a higher strength drive to occur, extra transistors 71 and 72 of similar polarities as transistors 67 and 69 have their sources and drains connected in parallel with transistors 67 and 69. Each of transistors 71 and 72 is driven from a pair of cross-connected AND gates which are driven from output terminal 21 and output terminal 21A respectively, and from delayed representations of the signals on those terminals, which delays are provided by the series of inverters 74 and 74A respectively.

Figure 5:
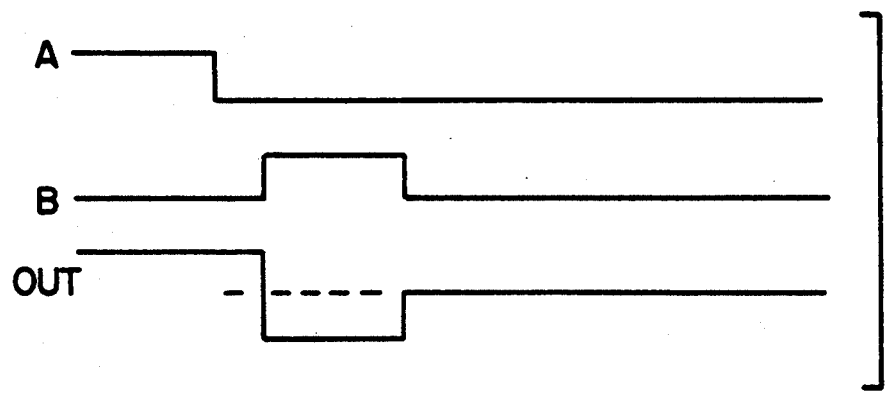

In operation, considering now FIG. 5, when the drive to inverter 68 goes to low logic level, and the delayed drive to transistor 71 goes high, the output signal on output 62 goes from high logic level to low logic level while both transistors 69 and 71 are enabled, then to a higher low logic level following that interval, when only one transistor 69 is enabled. The purpose of driving both transistors for a short interval (controlled by the delay in inverters 74 and 74A), to a very high level is to obtain a higher slew rate than if only a single transistor were driven.

This driving circuit can operate in several modes. For example, with the circuit just described, it can drive e.g. a 50 ohm load in a symmetrical manner. It can alternatively be driven with the p channel transistors disabled, thus causing the n channel devices to have open drains. Thus to provide the first mode, the output terminal is connected to the circuit just described. To provide the second mode, it is open circuited, and the conductor connected to the input of inverter 66 is grounded.

A person skilled in the art understanding the description above may now design alternative embodiments and variations using the principles described herein. All those falling within the scope of the claims appended hereto are considered to be part of the present invention.

We claim:

1. An output buffer for driving an output driver of a random access memory (RAM) circuit to either of opposite binary data values from a data source and a clock wherein the relative timing of data and clock signals is variable or undetermined comprising:
   (a) a source of data signals,
   (b) a source of clock signals having pulses one of which has a rising edge either being earlier than a leading edge of a data pulse, being later than the leading edge of the data pulse, or being in a race condition with the data pulse,
   (c) a latency counter for receiving the clock signals and for outputting a latent control,
   (d) means for summing the latent clock signal and the data pulse, and
   (e) means for providing a signal to an output driver from the summing means which is in synchronization with the latent clock signal.

2. An output buffer as defined in claim 1, in which the RAM is a synchronous DRAM, and in which the source of data signals is a databus read amplifier.

3. An output buffer as defined in claim 2 further including an output flip flop, means for driving opposite polarity data signals from the data pulse, and means for driving the flip flop to one of two states by the opposite polarity data signals.

* * * * *